United States Patent
Goldman

[11] Patent Number: 6,002,261
[45] Date of Patent: Dec. 14, 1999

[54] TRIMMING CIRCUIT

[75] Inventor: Richard Goldman, Gloucestershire, United Kingdom

[73] Assignee: Telefonaktiebolaget LM Ericsson, Stockholm, Sweden

[21] Appl. No.: 08/947,436

[22] Filed: Oct. 8, 1997

[30] Foreign Application Priority Data

Oct. 9, 1996 [GB] United Kingdom .................... 9621058

[51] Int. Cl.$^6$ ............................ G01R 31/02; G11C 17/16
[52] U.S. Cl. ....................... 324/550; 324/537; 365/225.7; 326/38; 257/530
[58] Field of Search ..................................... 324/537, 550, 324/555; 340/638; 365/96, 201, 225.7; 257/50, 529, 530, 567; 327/525, 526; 326/38; 438/467

[56] References Cited

U.S. PATENT DOCUMENTS

| | | | |
|---|---|---|---|
| 5,099,149 | 3/1992 | Smith | 326/38 |
| 5,148,391 | 9/1992 | Zagar | 365/96 |
| 5,150,016 | 9/1992 | Sawase et al. . | |
| 5,243,226 | 9/1993 | Chan | 326/38 |
| 5,302,546 | 4/1994 | Gordon et al. | 438/10 |
| 5,341,329 | 8/1994 | Takebuchi et al. . | |
| 5,345,110 | 9/1994 | Renfro et al. | 327/199 |
| 5,345,413 | 9/1994 | Fisher et al. | 365/96 |
| 5,397,939 | 3/1995 | Gordon et al. | 326/38 |
| 5,414,364 | 5/1995 | McCollum | 324/550 |
| 5,420,456 | 5/1995 | Galbi et al. | 257/529 |
| 5,442,589 | 8/1995 | Kowalski | 365/225.7 |
| 5,495,436 | 2/1996 | Callahan | 365/96 |
| 5,514,980 | 5/1996 | Pilling et al. | 326/38 |
| 5,525,909 | 6/1996 | McCollum | 324/550 |
| 5,552,743 | 9/1996 | Manning | 327/567 |
| 5,663,679 | 9/1997 | Manning | 327/567 |
| 5,706,238 | 1/1998 | Cutter et al. | 365/225.7 |
| 5,801,574 | 9/1998 | Martin et al. | 365/225.7 |
| 5,812,477 | 9/1998 | Casper et al. | 365/225.7 |

FOREIGN PATENT DOCUMENTS

| | | |
|---|---|---|
| 052566 | 5/1982 | European Pat. Off. . |
| 272977 | 6/1988 | European Pat. Off. . |
| 287338 | 10/1988 | European Pat. Off. . |
| 432049 | 6/1990 | European Pat. Off. . |
| 457463 | 1/1991 | European Pat. Off. . |
| 493957 | 12/1991 | European Pat. Off. . |
| 563852 | 3/1993 | European Pat. Off. . |
| 589475 | 9/1993 | European Pat. Off. . |
| 599388 | 11/1993 | European Pat. Off. . |
| 599390 | 11/1993 | European Pat. Off. . |
| 62-166558 | 7/1987 | Japan . |
| 1-319329 | 12/1989 | Japan . |
| 4-101513 | 4/1992 | Japan . |
| 6-216253 | 8/1994 | Japan . |
| 2296154 | 6/1996 | United Kingdom . |
| WO88/00372 | 1/1988 | WIPO . |
| WO90/02405 | 3/1990 | WIPO . |

*Primary Examiner*—Diep N. Do
*Attorney, Agent, or Firm*—Burns, Doane, Swecker & Mathis, L.L.P.

[57] ABSTRACT

To monitor the state of an antifuse capacitor, a transistor is connected to the capacitor such that it saturates only when the capacitor is not blown. Monitoring the base current of the transistor allows the state of the capacitor to be monitored without needing to use a conventional high-voltage comparator.

7 Claims, 1 Drawing Sheet

TRIMMING CIRCUIT

TECHNICAL FIELD OF THE INVENTION

The present invention relates to a trimming circuit, and in particular to a circuit which includes an antifuse, and means for detecting whether or not the antifuse has blown.

DESCRIPTION OF RELATED ART

Trimming circuits are known which include at least one antifuse, that is a fuse which, when blown, presents a short circuit across its terminals.

For example, in order to blow an antifuse capacitor, it may be necessary to apply a zapping voltage of several tens of volts across the terminals of the capacitor, whilst limiting the current. There is then a problem in sensing that the capacitor has blown. This arises because the sensing circuitry will then need to be able to distinguish between two voltages several volts apart and survive the zapping voltage of several tens of volts. Although high voltage comparator circuits are available, they are not easily incorporated into integrated circuit designs, because they require a relatively large area. This is a particular problem because a trimming circuit will typically include several antifuses, each requiring its own comparator, and so problems of size are multiplied accordingly.

SUMMARY OF THE INVENTION

The present invention seeks to overcome the problem of sensing when an antifuse capacitor has blown, by connecting a transistor to the capacitor, and relying on the fact that, in one state, the transistor will be saturated, and then detecting when saturation occurs. Specifically, the transistor may be connected to the antifuse capacitor such that, when the antifuse capacitor is not blown, the transistor is saturated and draws a large base current, whereas, when the antifuse capacitor is blown, the transistor is not saturated and draws a smaller base current. There is then provided means for monitoring the base current of the transistor, to determine whether the transistor is saturated, and hence to determine whether the antifuse capacitor is blown.

DETAILED DESCRIPTION OF PREFERRED EMBODIMENTS

Figure 1:
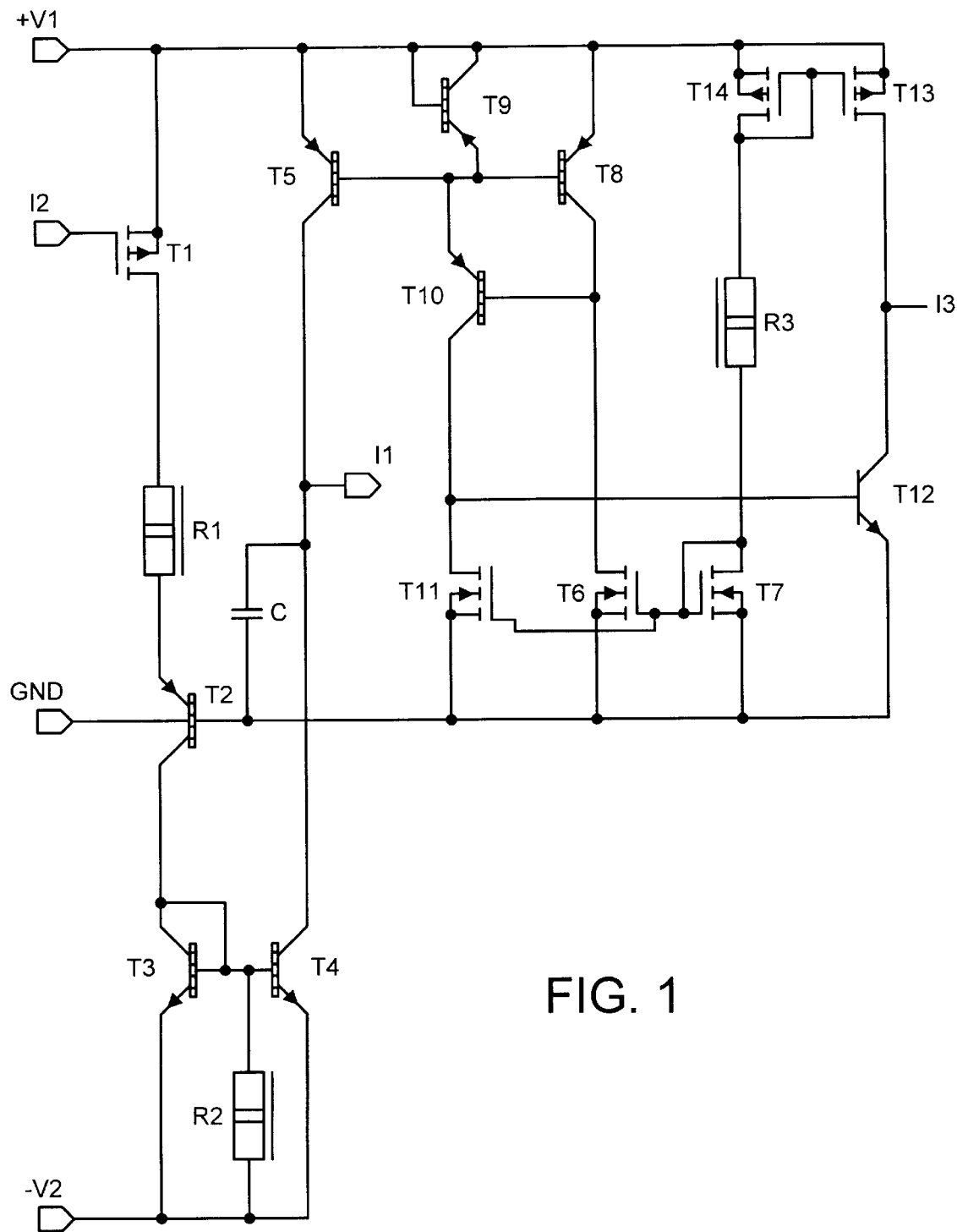
FIG. 1 is a circuit diagram of a trimming circuit in accordance with the invention.

FIG. 1 shows a trimming circuit, based on an antifuse capacitor C, which is a poly1 to poly2 capacitor, with a value of 13.8 fF. The capacitor acts as an antifuse, which means that, when it blows, which is when a voltage in the region of 45–55 V is applied across its plates, it forms an essentially short circuit resistance of typically 80 Ω. The capacitor C is connected between a ground rail GND of the circuit and a node I1. Before the capacitor C is blown, this node is pulled up towards the positive supply voltage +V1 by a transistor T5. In order to blow the capacitor, a voltage of at least about –50 V must be applied at the node I1, and thereafter the node I1 is essentially at earth voltage, 0 V.

The circuit used to blow the capacitor consists of transistors T1, T2, T3 and T4 and resistors R1 and R2. The transistor T1 is connected in series with a resistor R1, and with the base-emitter junction of a transistor T2, between a positive voltage supply rail +V1 and the ground rail GND. The positive supply rail +V1 supplies a voltage in the region of +5 V. The collector of transistor T2 is connected to a current mirror circuit comprising transistors T3 and T4 and resistor R2, the emitters of the transistors and one end of the resistor being connected to the negative supply voltage –V2, which is greater than 60 V below GND, for example –70 V. The collector of transistor T4 is connected to the node I1.

Thus, with I2 at GND, transistor T1 is conducting, and there is a voltage drop across the resistor R1. The resulting current flows through transistor T2 to the current mirror circuit, resulting in a corresponding current flowing through transistor T4, which pulls the node Ii down towards –V2.

With the current flowing through T4, and I1 approaching –V2, there is a sufficient voltage across the antifuse capacitor C to blow it.

Once blown, the capacitor is equivalent to an 80Ω resistor, i.e. effectively a short circuit. The node I1 is thus pulled to GND. The current through T4 is then switched off by switching I2 to +V1.

Thus, before the capacitor C blows, the node I1 is at a potential close to +V1, during zapping it is several tens of volts below GND, and, after the capacitor C has blown, it is at GND, zero volts. The remainder of the circuitry is for the purpose of detecting this difference. Although this could be achieved using a conventional high voltage comparator, such comparators have considerable surface areas, and are thus unsuitable for integration, particularly since a device may include several such trimming circuits.

Therefore, in order to sense that the capacitor C has blown, the transistor T5, which is a PNP transistor connected at its collector terminal to the node I1, and at its emitter terminal to the positive supply voltage +V1, is used.

Resistor R3 has a voltage of approximately 3 V applied across it, which, with suitable component values, causes a current of approximately 5 $\mu$A to flow through it. A current mirror circuit comprising transistors T6 and T7 causes a similar current of 5 $\mu$A to flow through transistor T8, and this current then acts as a reference current. Transistors T5 and T8 form a further current mirror circuit, with their emitters connected to the positive supply rail +V1, and their bases connected together. The bases of transistors T5 and T8 are also connected to the emitter of a transistor T9, which acts as a protection diode, with its base and collector terminals connected to the positive supply rail +V1. This prevents the bases of transistors T5 and T8 from being pulled much above the positive supply voltage +V1, which might otherwise happen when the terminal I1 is pulled down to the negative supply voltage –V2, and the capacitor C suddenly blows and pulls the terminal I1 up to GND. In the absence of the protection diode T9, this would run the risk that the voltage change at I1 would be coupled through the collector-base capacitance of T5, and similarly through T8, and damage the transistor T6.

The bases of transistors T5 and T8 are also connected to the emitter of a transistor T10. Thus, the base currents of transistors T5 and T8 flow through transistor T10, and then normally flow through transistor T11 to GND, T11 being configured as a 0.5 $\mu$A current sink. The collector of transistor T10 is connected to the base of a further transistor T12, which has its emitter connected to the ground rail GND. Transistor T13 is connected between transistor T12 and the positive supply rail +V1, and its gate is connected to the gate of transistor T14, which is connected between the resistor R3 and the positive supply rail +V1.

When the capacitor C is blown, and the node I1 is at GND, the transistor T5 is unsaturated, and has a relatively small base current, which is able to flow through transistor T10 and the current sink T11 to GND. With the combined base currents of transistor T5 and T8 flowing through transistor T11 to GND, the collector of the transistor T10 is pulled close to GND. Thus, in this situation, transistor T12 is turned off. With transistor T12 switched off, current flows through transistor T13, and an output terminal I3 is pulled up towards the positive supply voltage.

By contrast, if the capacitor C is not blown, it will be charged by transistor T5, such that I1 is pulled close to +V1 and therefore T5 will be saturated, and will therefore draw a much larger base current, for example up to 5 μA. This is much larger than can flow through the current sink T11. The excess current therefore flows into the base of the transistor T12, which is therefore turned on, and so the output terminal I3 is pulled low towards the ground rail.

It is therefore possible to monitor the voltage at terminal I3 to determine whether transistor T5 is saturated, and hence whether antifuse capacitor C has blown. This allows the state of the antifuse capacitor to be monitored in a simple way, using a relatively small number of components, so that the circuitry can be included in an integrated circuit design.

I claim:

1. A trimming circuit, comprising an antifuse capacitor, the antifuse capacitor having a first terminal connected to a ground rail, and a second terminal to which a voltage may be selectively applied to blow the capacitor, the circuit further comprising:

a first transistor (T5) connected between a first supply voltage rail and the second terminal of the capacitor;

a current source, connected to the second terminal of the capacitor is not blown, the first transistor is saturated and draws a large base current, whereas, when the antifuse capacitor is blown, the first transistor is not saturated and draws a smaller base current; and means for monitoring the base current of the first transistor to determine when the first transistor is saturated.

2. A trimming circuit as claimed in claim 1, wherein the current source comprises a first current mirror circuit comprising a first pair of transistors (T3, T4), a first transistor (T4) of the pair having its collector-emitter path connected between the second terminal of the capacitor and a second supply voltage which is sufficient to blow the antifuse capacitor, and a second transistor (T3) of the pair having its collector-emitter path connected between the first supply voltage rail and a second supply voltage through a further transistor (T1) which is controlled from an input terminal of the circuit.

3. A trimming circuit as claimed in claim 1, wherein the base terminal of the first transistor (T5) is connected to a current sink (T11), and to the base terminal of a second transistor (T12), such that, when the first transistor (T5) is unsaturated, its base current flows through the current sink (T11), and the second transistor (T12) is switched off, and, when the first transistor (T5) is saturated, the second transistor (T12) is switched on.

4. A trimming circuit as claimed in claim 3, wherein the first transistor forms a current mirror circuit with a third transistor (T8), the bases of the first and third transistors being connected together, and the circuit comprises means for drawing a reference current through the third transistor (T8).

5. A trimming circuit, comprising an antifuse capacitor, and means for selectively applying a suitable voltage thereto to blow the antifuse capacitor, and further comprising:

a first current mirror circuit, comprising first (T5) and second (T8) transistors, the first transistor (T5) being connected between one terminal of the antifuse capacitor and a supply voltage rail;

a third transistor (T10), connected to the bases of the first and second transistors (T5, T8), such that the base currents of the first and second transistors flow therethrough;

a current sink (T11), connected to receive the current flowing through the third transistor (T10);

a fourth transistor (T12), with its collector-emitter path connected in series with a load element (R3) between the supply voltage rail and a ground rail, and with its base terminal connected to the connection of the third transistor (T10) and the current sink (T11); and an output terminal (I3) located between the load element and through transistor (T12).

6. A trimming circuit as claimed in claim 5, wherein, when the antifuse capacitor is not blown, the first transistor (T5) is saturated and therefore has a large base current, which causes the base terminal of the fourth transistor (T12) to receive a current which switches the fourth transistor (T12) on, and therefore causes the voltage at the output terminal to approach ground voltage, whereas, when the antifuse capacitor is blown, the first transistor (T5) is not saturated, and therefore has a smaller base current, which flows through the current sink (T11), so that the base terminal of the fourth transistor (T12) receives no current, so that the fourth transistor (T12) is switched off, and therefore causes the voltage at the output terminal to go high.

7. A method of monitoring the state of an antifuse capacitor, the antifuse capacitor having a first terminal connected to a ground rail, and a second terminal to which a voltage may be selectively applied to blow the capacitor, the circuit further comprising a current source, connected to the second terminal of the capacitor, the method comprising:

connecting a first transistor (T5) between a first supply voltage rail and the second terminal of the capacitor, such that, when the antifuse capacitor is not blown, the first transistor is saturated and draws a large base current, whereas, when the antifuse capacitor is blown, the first transistor (T5) is not saturated and draws a smaller base current; and monitoring the base current of the first transistor (T5) to determine when the first transistor (T5) is saturated.

* * * * *